(12) United States Patent
Helke

(10) Patent No.: US 7,101,490 B2
(45) Date of Patent: Sep. 5, 2006

(54) PIEZOELECTRIC CERAMIC MATERIALS, BASED ON LEAD-ZICONATE-TITANATE (PZT), COMPRISING VALENCE-COMPENSATED COMPLEXES CONTAINING AG

(75) Inventor: Gunter Helke, Lauf-Heuching (DE)

(73) Assignee: Ceramtec AG Innovative Ceramic Engineering, Plochingen (DE)

( * ) Notice: Subject to any disclaimer, the term of this patent is extended or adjusted under 35 U.S.C. 154(b) by 23 days.

(21) Appl. No.: 10/490,494

(22) PCT Filed: Sep. 26, 2002

(86) PCT No.: PCT/DE02/03656

§ 371 (c)(1),
(2), (4) Date: May 24, 2004

(87) PCT Pub. No.: WO03/029164

PCT Pub. Date: Apr. 10, 2003

(65) Prior Publication Data

US 2004/0238784 A1    Dec. 2, 2004

(30) Foreign Application Priority Data

Sep. 29, 2001 (DE) ............................ 101 48 333
Jul. 12, 2002 (DE) ............................ 102 31 471

(51) Int. Cl.
*C04B 35/491* (2006.01)
*C04B 35/493* (2006.01)
*B32B 18/00* (2006.01)

(52) U.S. Cl. .............................. 252/62.9 PZ; 501/134
(58) Field of Classification Search .................... None
See application file for complete search history.

(56) References Cited

U.S. PATENT DOCUMENTS 3,518,198 A * 6/1970 Akashi et al. ........ 252/62.9 PZ
5,164,882 A   11/1992 Kanai et al.
6,230,378 B1 * 5/2001 Cramer et al. ............. 29/25.35

FOREIGN PATENT DOCUMENTS

WO        WO 01/93345      * 12/2001

* cited by examiner

*Primary Examiner*—C. Melissa Koslow
(74) *Attorney, Agent, or Firm*—Fulbright & Jaworski L.L.P.

(57) ABSTRACT

The characteristics of piezoceramic multilayer actuators based on lead-zirconate-titanate are determined to a great extent by the compatibility of PZT ceramics having a low sintering temperature with the AgPd internal metallisation during cofiring. It is important to take into consideration that Ag ions in PZT modifications have a high diffusivity at high temperatures (>800° C.) and in addition act as acceptor doping when integrated into the PZT system. The reduction of the fraction of the precious metal palladium, which prevents diffusion, is limited, as silver increasingly diffuses into the piezoceramic as the silver fraction in the internal electrodes increases. According to the invention, $Ag^+$ ions are used to form valence-compensated compositions of the PZT system. A higher level of deformation is maintained, i.e. the acceptor-donor effect in the system is very similar to that of the PZT system modified conventionally without internal electrodes.

5 Claims, 1 Drawing Sheet

— Without internal electrodes
---- AgPd 85/15
••• AgPd 70/30

PIEZOELECTRIC CERAMIC MATERIALS, BASED ON LEAD-ZICONATE-TITANATE (PZT), COMPRISING VALENCE-COMPENSATED COMPLEXES CONTAINING AG

This is a §371 of PCT/DE02/03656 filed Sep. 26, 2002, which claims priority from German 101 48 333.3 filed Sep. 29, 2001 and German 102 31 471.3 filed Jul. 12, 2002 all of which are hereby incorporated by reference in their entireties.

The invention relates to the modification of piezoelectric ceramic materials based on lead zirconate titanate (PZT).

The properties of piezoceramic multi-layer actuators based on lead zirconate titanate are determined to a great extent by the compatibility of low-sintering PZT-ceramic with the AgPd internal metalization during co-firing.

It should be noted here that Ag ions in PZT modifications have high diffusivity at high temperatures (>800° C.) and also act as an acceptor dopant when incorporated into the PZT system. A non-, or only partly, compensated acceptor substitution by donor ions such as $Nb^{5+}$ can lead to drastic changes in the ferroelectric properties and thus also in the deformation behavior of actuator materials. This effect must be taken into account when selecting the AgPd alloy for the internal electrodes. There is a limit to how far the content of the noble metal palladium can be reduced, as an increase in the silver content of the internal electrodes leads to increased diffusion of the silver in the piezoceramic.

The use of the alloy AgPd 70/30 for the internal metalization fulfills the premises for compatibility with the piezoceramic in the cofiring process. A Pd content of $\geq 30\%$ has the effect of preventing the diffusion of silver.

Ag-additives to originally valence-compensated PZT modifications act as acceptor dopants, which influence the polarity behavior. This also results in a reduction in deformation in the vicinity of an electric field.

Accordingly, the deformation characteristic is not stabilized by anticipating the introduction of $Ag^+$ ions when sintering piezoceramic laminates with AgPd internal metalization by adding Ag when formulating the composition of conventionally modified PZT compositions.

The object of the invention is to prevent diffusion of Ag in the ceramic material as far as possible in spite of a reduced Pd content of the electrode material.

The object is achieved with the aid of the present invention.

The invention consists in that in the modifications of piezoelectric ceramic materials based on lead zirconate titanate as valence-compensated compositions with n complex compounds in the multi-component systems with the general formula $PbTiO_3$—$PbZrO_3$-$\Sigma_n AM'_\alpha M''_\beta O_3$ with heterovalent ions, at least one ion M' is represented by $Ag^+$ and M'' are pentavalent cations of Sb, Ta, Nb, wherein $n \leq 3$, $\alpha = \frac{1}{4}$, $\beta = \frac{3}{4}$, the content of the respective complex compounds being $\leq 20$ mol % and $A \equiv A^{2+}$, populated by ions of the elements Pb, Ba, Ca, or Sr.

The multi-component systems with the general formula $PbTiO_3$—$PbZrO_3$-$\Sigma_n A'_\alpha A''_\beta BO_3$ with heterovalent ions are modified so that at least one ion A' is represented by $Ag^+$ and A'' are trivalent cations of Bi, La, Nd, wherein $n \leq 3$, $\alpha = \beta = \frac{1}{2}$, the content of the respective complex compounds being $\leq 20$ mol % and $B \equiv B^{4+}$, populated by ions of the elements Ti or Zr.

In the modified system, the hypothetical complex Sr$(Ag_{0.25}Nb_{0.75})O_3$ in a PZT-SAN $(1-y)Pb(Zr_xTi_{1-x})O_3$-$y$Sr $(Ag_{0.25}Nb_{0.75})O_3$ system, for example, may be considered as a coupled substitution of $Ag^+$ acceptor ions and $Nb^{5+}$ donor ions.

The composition $0.98Pb(Zr_{0.52}Ti_{0.48})O_3$-$0.02Sr$ $(Ag_{0.25}Nb_{0.75})O_3$ of the PZT-SAN system with an Ag content of 0.178 wt. % was compared with the model substance with the non-stoichiometric composition $0.98Pb(Zr_{0.52}Ti_{0.48})O_3$-$0.02Sr(Ag_{0.00}Nb_{0.75})O_3$ without $Ag^+$ ions for acceptor-donor valence compensation. The properties show that it is not possible to achieve valence compensation by removing the acceptor deficit via the diffusion of Ag from the internal electrodes. The deformation of the non-stoichiometric composition is substantially less than that of the stoichiometric composition.

The invention is explained in more detail with the aid of an embodiment. The polarization and deformation behavior of laminates with and without internal electrodes was investigated. The interaction of the modified PZT ceramics with different AgPd alloys (AgPd 70/30 and AgPd 85/15) during cofiring of the laminates is assessed and a solution for the reduction of the Pd content <30 is indicated.

Knowledge of effective x- and y-concentrations arises from the development of the PZT system: The properties relevant for the application of the modified PZT ceramics for sensors and actuators can be optimized in a narrow concentration range of x=0.46 to 0.49 for y=0.02. Accordingly, in an example, a PZT-SAN composition series $0.98$ $Pb(Zr_xTi_{1-x})O_3$-$0.02$ $Sr(Ag_{0.25}Nb_{0.75})O_3$ for x=0.51 to 0.55 was formulated in steps from $\Delta x=0.005$ and synthesized by the mixed oxide method.

When synthesizing (sintering) the PZT-SAN ceramics, an increased action of $Ag^+$ ions as acceptor dopants with coupled substitution of $Nb^{5+}$ donor ions was already The characteristic functional properties (piezoelectric and dielectric coefficients) of the compositions $0.98Pb$ $(Zr_{0.52}Ti_{0.48})O_3$-$0.02Sr(Ag_{0.25}Nb_{0.75})O3$ and $0.98Pb$ $(Zr_{0.53}Ti_{0.47})O_3$-$0.02Sr(Ag_{0.25}Nb_{0.75})O_3$ from this series of compositions are given in the following table as examples.

| | | x = 0.52 | x = 0.53 |
|---|---|---|---|
| Curie temperature | $T_c$, °C. | 350 | 348 |
| Coercive field strength | $E_c$, $10^6$ V/m | 1.27 | 1.11 |
| Permittivity | $\epsilon_{33}^T/\epsilon_0$ | 1959 | 2077 |
| Dielectric loss factor | tan $\delta x$ $10^{-4}$ | 129 | 145 |
| Planar electromechanical coupling factor | $k_p$ | 0.62 | 0.66 |
| Piezo modulus | $d_{33}$, pC/m | 423 | 498 |
| Re-orientation deformation (E = 3 · $10^6$ V/m) | $S_3$, 0/00 | 2.09 | 2.16 |

Dielectric and electromechanical properties of PZT-SAN ceramics

When forming valence-compensated compositions of the PZT-SAN system, a high level of deformation is obtained upon polarization.

The influence of the diffusion of silver during cofiring of the laminates with internal electrodes of differing Pd contents is less pronounced. The values of the coercive field strength and deformation for the composition $0.98Pb$ $(Zr_{0.52}Ti_{0.48})O_3$-$0.02Sr(Ag_{0.25}Nb_{0.75})O_3$ of the PZT-SAN system for example are virtually the same for both internal metalizations, as can be seen from FIGS. 1 and 2.

Figure 1:
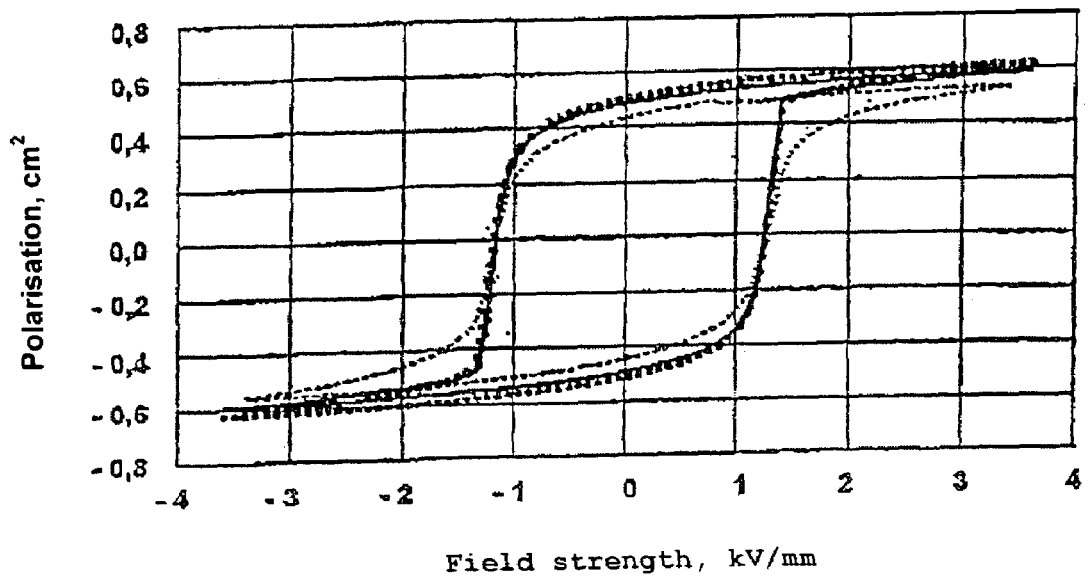
FIG. 1 shows the polarization behavior.
Figure 2:
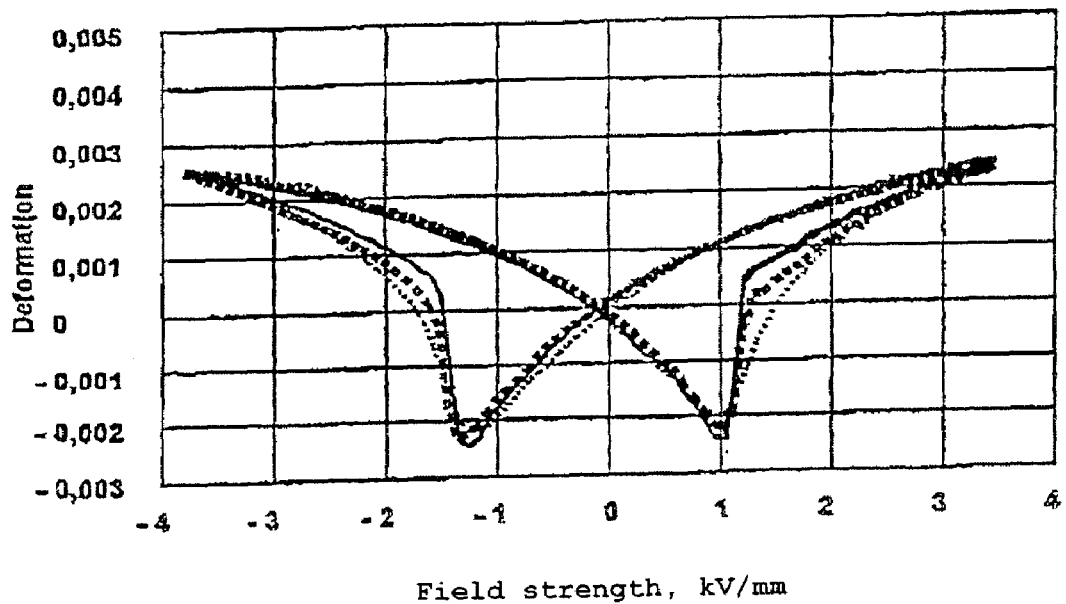
FIG. 2 shows the deformation behavior of sintered laminates of $0.98Pb(Zr_{0.52}Ti_{0.48})O_3$-$0.02Sr(Ag_{0.25}Nb_{0.75})O_3$ ceramics with and without AgPd internal electrodes.

Reducing the diffusion of silver during cofiring of laminates with internal electrodes makes it possible to use AgPd alloys with reduced Pd content. The values of coercive field strength and deformation for the composition of $0.98Pb(Zr_{0.52}Ti_{0.48})O_3$-$0.02Sr(Ag_{0.25}Nb_{0.75})O_3$ of the PZT-SAN system for internal metalization with AgPd 70/30 and AgPd 85/15 are virtually the same. When using $Ag^+$ ions to form valence-compensated compositions of the PZT system, a high level of deformation is still obtained, i.e. the acceptor-donor action of the system is very similar to that of the conventionally modified PZT system without internal electrodes, as can be seen from FIG. 2.

The invention claimed is:

1. A modification of a piezoelectric ceramic material based on lead zirconate titanate of the formula $(1-y)Pb(Zr_xTi_{1-x})O_3$-$yA^{2+}(Ag_\alpha B_\beta^{5+})O_3$, wherein $A^{2+}$ is an ion of an element selected from the group consisting of Pb, Ba, Ca and Sr and $B^{5+}$ is an ion selected from the group consisting of an element Sb, Ta and Nb and $y=0.001$ to $0.10$, $x=0.45$ to $0.55$ and $\beta=¼$ and $\beta=¾$.

2. A modification of a piezoelectric ceramic material based on lead zirconate titanate as a valence-compensated composition with an n complex compound in the multi-component system having the general formula $PbTiO_3$—$PbZrO_3$-$\Sigma AM'_\alpha M''_\beta O_3$ with heterovalent ions, wherein M' is $Ag^+$ and M" is a pentavalent cation selected from the group consisting of Sb, Ta, and Nb, wherein $n \leq 3$, $\alpha=¼$, $\beta=¾$, wherein the content of the respective complex compounds is $\leq 20$ mol. %, and $A \equiv A^{2+}$, and is an ion of an element selected from the group consisting of Pb, Ba, Ca, and Sr.

3. A modification of a piezoelectric ceramic material based on lead zirconate titanate as a valence-compensated composition with an n complex compound in the multi-component systems with the general formula $PbTiO_3$—$PbZrO_3$-$\Sigma_n A'_\alpha A''_\beta BO_3$ with heterovalent ions, wherein A' is $Ag^+$ and A" is a trivalent cation selected from the group consisting of Bi, La and Nd, wherein $n \leq 3$, $\alpha=\beta=½$, wherein the content of the respective complex compounds is $\leq 20$ mol. % and $B \equiv B^{4+}$, and is an ion of an element selected from the group consisting of Ti and Zr.

4. A modification of a piezoelectric ceramic material based on lead zirconate titanate as a valence-compensated composition with an n complex compound in the multi-component system having the general formula $PbTiO_3$—$PbZrO_3$-$\Sigma_n AM'_\alpha M''_\beta O_3$ with heterovalent ions, wherein M' is $Ag^+$ and M" is a pentavalent cation selected from the group consisting of Sb, Ta, and Nb, wherein $n \leq 3$, $\alpha=¼$, $\alpha=¾$, wherein the content of the respective complex compounds is $\leq 20$ mol. %, and $A \equiv A^{2+}$ and is an ion of an element selected from the group consisting of Pb, Ba, Ca, and Sr, and wherein the Pb ion in the base system $PbTiO_3$—$PbZrO_3$(PZT) is substituted partially, by up to 10 mol %, with at least one divalent ion selected from the group consisting of Ba, Ca and Sr.

5. A modification of a piezoelectric ceramic material based on lead zirconate titanate as a valence-compensated composition with an n complex compound in the multi-component systems with the general formula $PbTiO_3$—$PbZrO_3$-$\Sigma_n A'_\alpha A''_\beta BO_3$ with heterovalent ions, wherein A' is Ag+ and A" is a trivalent cation selected from the group consisting of Bi, La and Nd, wherein $n \leq 3$, $\alpha=\beta=½$, wherein the content of the respective complex compounds is $\leq 20$ mol %, and $B \equiv B^{4+}$, and is an ion of an element selected from the group consisting of Ti and Zr wherein the Pb ion in the base system $PbTiO_3$—$PbZrO_3$(PZT) is substituted partially, by up to 10 mol %, with a divalent ion of an element selected from the group consisting of Ba, Ca and Sr.

* * * * *